(12) United States Patent
Kim et al.

(10) Patent No.: US 12,136,540 B2
(45) Date of Patent: Nov. 5, 2024

(54) SUBSTRATE PROCESSING DEVICE AND METHOD FOR MANUFACTURING SAME

(71) Applicants: LG DISPLAY CO., LTD., Seoul (KR); ELECTRO STATIC TECHNOLOGY, INC., Osan-si (KR)

(72) Inventors: Young Gon Kim, Hwaseong-si (KR); Jong Woo Lim, Suwon-si (KR); Nam Hui Lee, Osan-si (KR); Min Choul Hyun, Gumi-si (KR); Dongwook Kim, Paju-si (KR); Jewook Kim, Paju-si (KR)

(73) Assignees: LG DISPLAY CO., LTD., Seoul (KR); ELECTRO STATIC TECHNOLOGY, INC., Osan-si (KR)

( * ) Notice: Subject to any disclaimer, the term of this patent is extended or adjusted under 35 U.S.C. 154(b) by 0 days.

(21) Appl. No.: 18/540,331

(22) Filed: Dec. 14, 2023

(65) Prior Publication Data
US 2024/0136162 A1 Apr. 25, 2024
US 2024/0234109 A9 Jul. 11, 2024

(30) Foreign Application Priority Data
Oct. 19, 2022 (KR) .................. 10-2022-0134659

(51) Int. Cl.
*B23P 19/04* (2006.01)
*C23C 14/30* (2006.01)
(Continued)

(52) U.S. Cl.
CPC ........ *H01J 37/32724* (2013.01); *C23C 14/30* (2013.01); *C23C 14/50* (2013.01);
(Continued)

(58) Field of Classification Search
CPC .......... H01J 37/32724; H01J 2237/002; H01J 2237/2007; H01J 2237/3323; C23C 14/30; C23C 14/50; C23C 14/541; H10K 71/166
See application file for complete search history.

(56) References Cited

U.S. PATENT DOCUMENTS

| | | | |
|---|---|---|---|
| 6,846,213 B2 * | 1/2005 | Sato | H01J 9/027 445/6 |
| 10,373,854 B2 * | 8/2019 | Uefuji | H01L 21/6831 |

(Continued)

FOREIGN PATENT DOCUMENTS

| | | | |
|---|---|---|---|
| JP | 2006-342367 A | 12/2006 | |
| JP | 2009-115448 A | 5/2009 | |

(Continued)

OTHER PUBLICATIONS

Notice of allowance issued on Mar. 13, 2024 for Korean Patent Application No. 10-2022-0134659.
(Continued)

*Primary Examiner* — Paul D Kim
(74) *Attorney, Agent, or Firm* — Morgan, Lewis & Bockius LLP

(57) ABSTRACT

A substrate processing apparatus may be utilized, for example, for a horizontally fixed organic material deposition equipment for manufacturing large-area displays. A substrate processing apparatus may include a titanium cooling plate having an upper surface and a lower surface; an electrostatic chuck including a first dielectric layer provided on the lower surface, an electrode layer provided on the first dielectric layer, and a second dielectric layer provided on the first dielectric layer and the electrode layer, and chucking a glass substrate using an electrostatic force; and a yoke plate positioned on the upper surface and chucking a mask using a magnetic force. The titanium cooling plate may further
(Continued)

includes a first channel provided from the upper surface, a second channel provided from the first channel, and a titanium cover plate coupled to the first channel. The titanium cooling plate may provide a cooling flow path using the second channel.

24 Claims, 10 Drawing Sheets

(51) Int. Cl.
    *C23C 14/50*     (2006.01)
    *C23C 14/54*     (2006.01)
    *H01J 37/32*     (2006.01)
    *H05K 13/04*     (2006.01)
    *H10K 71/16*     (2023.01)

(52) U.S. Cl.
    CPC ....... *C23C 14/541* (2013.01); *H01J 2237/002* (2013.01); *H01J 2237/2007* (2013.01); *H01J 2237/3323* (2013.01); *H10K 71/166* (2023.02)

(56) References Cited

U.S. PATENT DOCUMENTS

| | | | |
|---|---|---|---|
| 11,152,244 B2 * | 10/2021 | Yamaguchi | ....... H01L 21/67248 |
| 2006/0272802 A1 | 12/2006 | Sakayori et al. | |
| 2020/0227300 A1 | 7/2020 | Lee et al. | |

FOREIGN PATENT DOCUMENTS

| | | |
|---|---|---|
| JP | 2011-082405 A | 4/2011 |
| JP | 2019-059966 A | 4/2019 |
| JP | 2019-099912 A | 6/2019 |
| JP | 2020-113692 A | 7/2020 |
| KR | 10-1103821 B1 | 1/2012 |
| KR | 102199738 B1 | 1/2021 |
| WO | 2022/146845 A1 | 7/2022 |

OTHER PUBLICATIONS

Office Action issued on May 28, 2024 in Japanese Patent Application No. 2023-213428 Note: JP2019-099912 cited therein are already of record.

* cited by examiner

SUBSTRATE PROCESSING DEVICE AND METHOD FOR MANUFACTURING SAME

CROSS-REFERENCE TO RELATED APPLICATION

This application claims the benefit of and priority to Korean Patent Application No. 10-2022-0134659, filed on Oct. 19, 2022, the entirety of which is incorporated herein by reference for all purposes as if fully set forth herein.

BACKGROUND

1. Technical Field

The disclosure relates to a substrate processing device and particularly to, for example, without limitation, a substrate processing device that may be utilized for a horizontally fixed organic material deposition equipment for manufacturing large-area displays.

2. Description of the Related Art

In the process of manufacturing displays, in particular large displays, a substrate processing stage is crucial for achieving high-quality, defect-free displays. Substrate processing systems face several challenges that may impact manufacturing efficiency, yield, and overall product quality. For example, achieving uniform coating, deposition, or treatment across large substrate surfaces is a complex task. Existing systems struggle to maintain consistent processing parameters, leading to variations in display quality and performance. With the increasing demand for high-resolution displays, there is a growing need for improved processing speed without compromising quality. Existing substrate processing systems often exhibit limitations in throughput, adversely affecting overall manufacturing productivity. Further, the diversity in display sizes necessitates a substrate processing system that can seamlessly accommodate different substrate dimensions, especially large dimensions.

The description of the related art should not be assumed to be prior art merely because it is mentioned in or associated with this section. The description of the related art may include information that describes one or more aspects of the subject technology, and the description in this section does not limit the invention.

SUMMARY

The inventors of the disclosure have recognized the problems and disadvantages of the related art and have performed extensive research and experiments. The inventors of the disclosure have thus invented new apparatuses and methods that substantially obviate one or more problems due to limitations and disadvantages of the related art.

One or more example embodiments of the disclosure are directed to provide a substrate processing device for horizontally fixed organic material deposition equipment for manufacturing large-area displays.

One or more example embodiments of the disclosure are directed to provide a substrate processing device, which may uniformly control (cool) the temperature of the entire area of a glass substrate.

One or more example embodiments of the disclosure are directed to provide a substrate processing device, which may sufficiently chuck a mask under a glass substrate with a magnetic force.

One or more example embodiments of the disclosure are directed to provide a substrate processing device, which may sufficiently chuck a large-area substrate (e.g., 6th generation full glass substrate through 8.6th generation half glass substrate) with an electrostatic force without warping.

One or more example embodiments of the disclosure are directed to provide a substrate processing device, which has a cooling flow path with a reduced thickness and various shapes.

A substrate processing apparatus, according to one or more example embodiments of the disclosure, may comprise a titanium cooling plate having an upper surface and a lower surface opposite to the upper surface, an electrostatic chuck including a first dielectric layer provided on the lower surface of the titanium cooling plate, an electrode layer provided on the first dielectric layer, and a second dielectric layer provided on the first dielectric layer and the electrode layer, and chucking a glass substrate supplied from below using an electrostatic force, and a yoke plate positioned on the upper surface of the titanium cooling plate and chucking a mask supplied from below the glass substrate using a magnetic force. The titanium cooling plate may further include a first channel provided from the upper surface toward the lower surface and having a first width, a second channel provided from the first channel toward the lower surface and having a second width smaller than the first width, and a titanium cover plate welded to the first channel. A cooling flow path through which a cooling medium flows may be provided inside the titanium cooling plate by the second channel. The upper surface and the lower surface may be flat.

In one or more examples, the titanium cover plate may be welded to the first channel by an electron beam radiation device in a vacuum chamber to be prevented from oxidation when welded.

In one or more examples, the titanium cooling plate may have a thickness of 7 mm to 12 mm at which the mask is not warped by its own weight while being simultaneously chucked to the 8.6th generation half glass substrate by a magnetic force of the yoke plate.

In one or more examples, the titanium cooling plate may include titanium (Ti) Grade 2.

In one or more examples, the titanium cooling plate may further include a plurality of supporting member attached along an edge and one or more auxiliary supporting members attached to an area corresponding to a dead zone of the mask and the 8.6th generation half glass substrate, to prevent the titanium cooling plate from warping. The area may be an inner area.

In one or more examples, the first dielectric layer may be directly coated on the lower surface of the titanium cooling plate by an atmospheric plasma spray method, and the second dielectric layer may be directly coated on the first dielectric layer and the electrode layer by the atmospheric plasma spray method.

In one or more examples, the first dielectric layer may be directly coupled to the lower surface of the titanium cooling plate without an adhesive layer, and the second dielectric layer may be directly coupled to the first dielectric layer and the electrode layer without an adhesive layer.

In one or more examples, the cooling flow path may include at least two cooling flow paths each having a meandering shape as viewed in a plan view.

In one or more examples, the mask may include an invar material.

In one or more examples, the glass substrate may have a size of 1850 mm×1500 mm to 2290 mm×1310 mm.

A method for manufacturing a substrate processing device, according to one or more example embodiments of the disclosure, may comprise providing a titanium cooling plate having an upper surface and a lower surface opposite to the upper surface, providing a first channel (having a first width) from the upper surface of the titanium cooling plate toward the lower surface and providing a second channel (having a second width smaller than the first width) from the first channel toward the lower surface, welding the first channel of the titanium cooling plate (with the first channel covered with a titanium cover plate), by an electron beam radiation device in a vacuum chamber, and providing an electrostatic chuck by directly providing a first dielectric layer on the lower surface of the titanium cooling plate by an atmospheric plasma method, providing an electrode layer on the first dielectric layer, and directly providing a second dielectric layer on the first dielectric layer and the electrode layer by the atmospheric plasma method.

A method for manufacturing a display using a substrate processing apparatus, according to one or more example embodiments of the disclosure, may comprise providing the substrate processing apparatus including a titanium cooling plate, an electrostatic chuck and a yoke plate, placing a glass substrate using the electrostatic chuck, and placing a mask to the glass substrate using the yoke plate. The display may include or may be made using the glass substrate.

A substrate fixing device, according to one or more example embodiments of the disclosure, may comprise a titanium cooling plate including an upper surface and a lower surface opposite to the upper surface, and an electrostatic chuck including a first dielectric layer disposed on the lower surface of the titanium cooling plate, an electrode layer disposed on the first dielectric layer, and a second dielectric layer disposed on the first dielectric layer and the electrode layer. The electrostatic chuck may fix a glass substrate disposed under the titanium cooling plate using an electrostatic force. The titanium cooling plate may further include a first channel having a first width provided from the upper surface toward the lower surface, a second channel having a second width smaller than the first width provided from the first channel toward the lower surface, and a titanium cover plate coupled to the first channel.

A substrate fixing device, according to one or more example embodiments of the disclosure, may comprise an upper plate including an upper surface and a lower surface, and a lower plate including a first dielectric layer provided at least on the lower surface of the upper plate, an electrode layer provided at least on the first dielectric layer, and a second dielectric layer provided at least on the electrode layer. The upper plate may include a metal material. The lower plate may fix a substrate positioned under the upper plate using an electrostatic force. The upper plate may further include a channel for cooling. The channel may be disposed at least within the upper plate, below the upper surface, and above the lower surface.

One or more example embodiments of the disclosure provide a substrate processing device, which may uniformly control (cool) the temperature of the entire area of the glass substrate by integrating a cooling plate and an electrostatic chuck, and a method for manufacturing the same. In other words, unlike an approach in which the electrostatic chuck is provided on the aluminum plate, and a separate cooling plate is provided on the rear surface of the aluminum plate, embodiments of the disclosure directly provide the electrostatic chuck on a titanium cooling plate having a cooling flow path, thereby enhancing temperature uniformity and cooling efficiency on the glass substrate.

One or more example embodiments of the disclosure provide a substrate processing device for horizontally fixed organic material deposition equipment for manufacturing large-area displays, which may sufficiently chuck the mask under the glass substrate with a magnetic force by using a titanium cooling plate with a reduced thickness, and a method for manufacturing the same. In other words, according to one or more example embodiments of the disclosure, as the electrostatic chuck is provided on a titanium cooling plate with a thickness of about 7 mm to about 12 mm, the magnetic force of the yoke plate positioned on an upper surface of the titanium cooling plate may be sufficiently transferred to the mask positioned below a lower surface of the titanium cooling plate.

One or more example embodiments of the disclosure provide a substrate processing device, which may sufficiently chuck a large-area substrate (e.g., 6th generation full glass substrate through 8.6th generation half glass substrate) with an electrostatic force without warping by using a titanium cooling plate having a reduced thickness and high rigidity, and a method for manufacturing the same. Further, according to one or more example embodiments of the disclosure, as the titanium cooling plate has a reduced thickness, the weight of the device may be significantly reduced. Thus, the complexity of the aligning device (e.g., unloaded vehicle weight (UVW) stage) or moving equipment (e.g., magnetic levitation device) may be reduced.

One or more example embodiments of the disclosure provide a substrate processing device, which may provide excellent glass substrate cooling efficiency by being able to form a cooling flow path despite its reduced thickness, and a method for manufacturing the same. In other words, according to one or more example embodiments of the disclosure, a channel is provided by one surface of the titanium cooling plate, and a partial area of the channel is blocked with a titanium cover plate, and then, the titanium cover plate is welded by electron beams in a vacuum chamber without oxidation. Thus, a cooling flow path may be provided in a cooling plate with a reduced thickness.

Other features, advantages, and aspects of the disclosure are set forth in part herein and in part will become apparent from the disclosure or may be learned by practice of the inventive concepts provided herein. Other features, advantages, and aspects of the disclosure may be realized and attained by the descriptions provided in the disclosure, or derivable therefrom, and the claims hereof as well as the appended drawings. It is intended that all such features, advantages, and aspects be included within this description, be within the scope of the disclosure, and be protected by the following claims. Nothing in this section should be taken as a limitation on those claims. Further aspects and advantages are discussed below in conjunction with embodiments of the disclosure.

It is to be understood that both the foregoing description and the following description of the disclosure are examples, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles and examples of the disclosure.

In the drawings.

Figure 1:
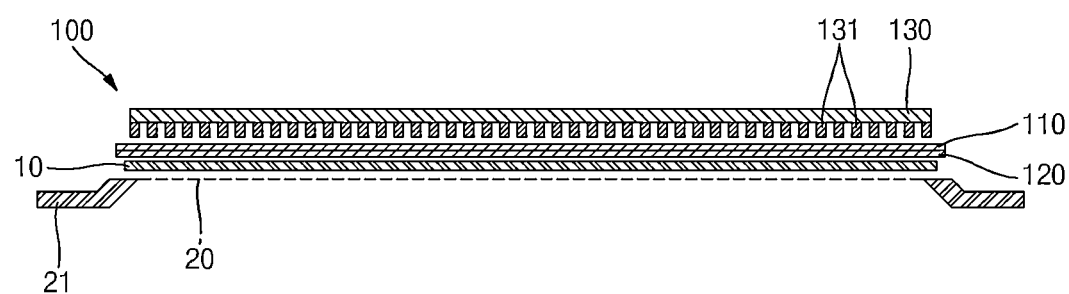
FIG. 1 is a cross-sectional view illustrating an example substrate processing device according to one or more example embodiments of the disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Reference is now made in detail to embodiments of the disclosure, examples of which may be illustrated in the accompanying drawings. In the following description, when a detailed description of well-known methods, functions, structures or configurations may unnecessarily obscure aspects of the disclosure, the detailed description thereof may have been omitted for brevity. Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. Unless stated otherwise, the same reference numerals may be used to refer to the same or substantially the same elements throughout the specification and the drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the disclosure, and implementation methods thereof, are clarified through the embodiments described with reference to the accompanying drawings. The disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the disclosure.

Shapes, dimensions (e.g., sizes, lengths, widths, heights, thicknesses, locations, radii, diameters, and areas), proportions, ratios, angles, numbers, the number of elements, and the like disclosed herein, including those illustrated in the drawings, are merely examples, and thus, the disclosure is not limited to the illustrated details. Further, dimensions of layers may be exaggerated for ease or clarity of description.

When the term "comprise," "have," "include," "contain," "constitute," "made of," "formed of," "composed of," or the like is used with respect to one or more elements (e.g., layers, films, regions, components, sections, members, parts, regions, areas, portions, steps, operations, and/or the like), one or more other elements may be added unless a term such as "only" or the like is used. The terms used in the disclosure are merely used in order to describe particular example embodiments, and are not intended to limit the scope of the disclosure. The terms of a singular form may include plural forms unless the context clearly indicates otherwise. The word "exemplary" is used to mean serving as an example or illustration. Embodiments are example embodiments. Aspects are example aspects. "Embodiments," "examples," "aspects," and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

In one or more aspects, unless explicitly stated otherwise, an element, feature, or corresponding information (e.g., a level, range, dimension, size, or the like) is construed to include an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

When a positional relationship between two elements (e.g., layers, films, regions, components, sections, members, parts, regions, areas, portions, and/or the like) are described using any of the terms such as "on," "on a top of," "upon," "on top of," "over," "under," "above," "upper," "below," "lower," "beneath," "near," "close to," "adjacent to," "beside," "next to," "at or on a side of," and/or the like indicating a position or location, one or more other elements may be located between the two elements unless a more limiting term, such as "immediate(ly)," "direct(ly)," or "close(ly)," is used. For example, when an element and another element are described using any of the foregoing terms, this description should be construed as including a case in which the elements contact each other directly as well as a case in which one or more additional elements are disposed or interposed therebetween. Furthermore, the spatially relative terms such as the foregoing terms as well as other terms such as "front," "rear," "back," "left," "right," "top," "bottom," "downward," "upward," "up," "down," "column," "row," "vertical," "horizontal," "diagonal," and the like refer to an arbitrary frame of reference. For example, these terms may be used for an example understanding of a relative relationship between elements, including any correlation as shown in the drawings. However, embodiments of the disclosure are not limited thereby or thereto. The spatially relative terms are to be understood as terms including different orientations of the elements in use or in operation in addition to the orientation depicted in the drawings or described herein. For example, where a lower element or an element positioned under another element is overturned, then the element may be termed as an upper element or an element positioned above another element. Thus, for example, the term "under" or "beneath" may encompass, in meaning, the term "above" or "over." An example term "below" or the like, can include all directions, including directions of "below," "above," and diagonal directions. Likewise, an example term "above," "on," or the like can include all directions, including directions of "above," "on," "below," and diagonal directions.

In describing a temporal relationship, when the temporal order is described as, for example, "after," "subsequent," "next," "before," "preceding," "prior to," or the like, a case that is not consecutive or not sequential may be included and thus one or more other events may occur therebetween, unless a more limiting term, such as "just," "immediate(ly)," or "direct(ly)," is used.

It is understood that, although the terms "first," "second," and the like may be used herein to describe various elements (e.g., layers, films, regions, components, sections, members, parts, regions, areas, portions, steps, operations, and/or the like), these elements should not be limited by these terms, for example, to any particular order, precedence, or number of elements. These terms are used only to distinguish one element from another. For example, a first element may denote a second element, and, similarly, a second element may denote a first element, without departing from the scope of the disclosure. Furthermore, the first element, the second element, and the like may be arbitrarily named according to the convenience of those skilled in the art without departing from the scope of the disclosure. For clarity, the functions or structures of these elements (e.g., the first element, the second element, and the like) are not limited by ordinal numbers or the names in front of the elements. Further, a first element may include one or more first elements. Similarly, a second element or the like may include one or more second elements or the like.

In describing elements of the disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element (e.g., layer, film, region, component, section, member, part, region, area, portion, or the like) is "connected," "coupled," "attached," "adhered," or the like to another element, the element can not only be directly connected, coupled, attached, adhered, or the like to another element, but also be indirectly connected, coupled, attached, adhered, or the like to another element with one or more intervening elements disposed or interposed between the elements, unless otherwise specified.

For the expression that an element (e.g., layer, film, region, component, section, member, part, region, area, portion, or the like) "contacts," "overlaps," or the like with another element, the element can not only directly contact, overlap, or the like with another element, but also indirectly contact, overlap, or the like with another element with one or more intervening elements disposed or interposed between the elements, unless otherwise specified.

The phase that an element (e.g., layer, film, region, component, section, member, part, region, area, portion, or the like) is "provided," "disposed," "connected," "coupled," or the like in, on, with or to another element may be understood, for example, as that at least a portion of the element is provided, disposed, connected, coupled, or the like in, on, with or to at least a portion of another element. The phrase "through" may be understood, for example, to be at least partially through or entirely through. The phase that an element (e.g., layer, film, region, component, section, member, part, region, area, portion, or the like) "contacts," "overlaps," or the like with another element may be understood, for example, as that at least a portion of the element contacts, overlaps, or the like with a least a portion of another element.

The terms such as a "line" or "direction" should not be interpreted only based on a geometrical relationship in which the respective lines or directions are parallel, perpendicular, diagonal, or slanted with respect to each other, and may be meant as lines or directions having wider directivities within the range within which the components of the disclosure may operate functionally.

The term "at least one" should be understood as including any and all combinations of one or more of the associated listed items. For example, each of the phrases "at least one of a first item, a second item, or a third item" and "at least one of a first item, a second item, and a third item" may represent (i) a combination of items provided by two or more of the first item, the second item, and the third item or (ii) only one of the first item, the second item, or the third item. Further, "at least some," "some," "some elements," "a portion," "portions," "at least a portion," "at least portions," "a part," "at least a part," "parts," "at least parts," "one or more," or the like of the plurality of elements can represent (i) one element of the plurality of elements, (ii) a part of the plurality of elements, (iii) parts of the plurality of elements, (iv) multiple elements of the plurality of elements, or (v) all of the plurality of elements.

The expression of a first element, a second elements "and/or" a third element should be understood as one of the first, second and third elements or as any or all combinations of the first, second and third elements. By way of example, A, B and/or C may refer to only A; only B; only C; any of A, B, and C (e.g., A, B, or C); some combination of A, B, and C (e.g., A and B; A and C; or B and C); or all of A, B, and C. Furthermore, an expression "A/B" may be understood as A and/or B. For example, an expression "A/B" may refer to only A; only B; A or B; or A and B.

In one or more aspects, the terms "between" and "among" may be used interchangeably simply for convenience unless stated otherwise. In one or more aspects, the phrases "each other" and "one another" may be used interchangeably simply for convenience unless stated otherwise. In one or more aspects, the phrases "one or more among" and "one or more of" may be used interchangeably simply for convenience unless stated otherwise.

The term "or" means "inclusive or" rather than "exclusive or." For example, "a or b" may mean "a," "b," or "a and b." For example, "a, b or c" may mean "a," "b," "c," "a and b," "b and c," "a and c," or "a, b and c."

Features of various embodiments of the disclosure may be partially or entirely coupled to or combined with each other, may be technically associated with each other, and may be variously operated, linked or driven together in various ways. Embodiments of the disclosure may be implemented or carried out independently of each other or may be implemented or carried out together in a co-dependent or related relationship. In one or more aspects, the components of each apparatus and device according to various embodiments of the disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example embodiments.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

In the following description, various example embodiments of the disclosure are described in detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, embodiments of the disclosure are not limited to a scale, dimension, size, and thickness illustrated in the drawings.

Generally, a substrate processing device may refer to a device for depositing a film on a substrate or etching a film deposited on a substrate. Display panels, semiconductor devices, optical devices, and solar cells may be manufactured by forming and etching films utilizing a substrate processing device.

A substrate processing device may include a chamber for providing a space where a substrate is processed, a substrate mounting unit for mounting the substrate, and a gas jetting unit for jetting a gas for depositing or etching films on the substrate.

For example, the substrate mounting unit for manufacturing displays may use a susceptor with a heating and/or cooling function, for uniformly maintaining the temperature of the substrate to enhance processing efficiency in various processes. Further, in the substrate mounting unit for manufacturing displays, an electrostatic chuck which uses electrostatic force for fixing the substrate may replace a vacuum chuck or adhesive chuck and may be used in the overall display manufacturing process.

As an example, among display devices, organic light emitting display devices draw attention by their wide viewing angle, excellent contrast and fast response. Such an organic light emitting display device may include an organic light emitting layer between two electrodes facing each other and may further include one or more various thin films. Accordingly, the organic light emitting display device undergoes multiple deposition processes to form various thin films.

However, a high-density plasma process is required to manufacture an organic light emitting display device having a large area. However, as the density of plasma in the chamber increases, the temperature in each area of the substrate processing device is rendered non-uniform, causing an increased deviation in deposition quality between the areas of the substrate. Further, to form an organic thin film on the substrate in the organic light emitting display device, each pixel needs to be deposited after a mask positioned on the front surface of the substrate processing device is fixed to the substrate at the rear surface of the substrate processing device. However, as the thickness of the substrate processing device increases in proportion to an increase in the size of the substrate processing device for fixing the substrate of the large-area organic light emitting display device, it is difficult to fix the mask with a magnetic force. Further, the increase in the size of the substrate of the organic light emitting display device leads to an increase in the size and weight of the substrate processing device, increasing warping of the substrate processing device. Moreover, the increased weight of the substrate processing device may complicate the structure of various devices for transporting the substrate processing device. One or more aspects and embodiments of the disclosure are directed to substantially obviating one or more problems and limitations described herein.

FIG. 1 is a cross-sectional view illustrating an example substrate processing device 100 according to one or more example embodiments of the disclosure. An example substrate processing device 100 may be utilized, for example, for horizontally fixed organic material deposition equipment for manufacturing large-area displays. A substrate processing device may be sometimes referred to as a substrate processing apparatus. A substrate processing device or a portion thereof may be sometimes referred to as a substrate fixing device. As illustrated in FIG. 1, an example substrate processing device 100 for manufacturing large-area displays according to one or more example embodiments of the disclosure may include a titanium cooling plate 110, an electrostatic chuck 120 for sucking (or drawing in, bringing in, pulling in, or taking in) and fixing a glass substrate 10 for a display, and a yoke plate 130 positioned above the electrostatic chuck 120 to fix a mask 20 positioned under the glass substrate 10 using a magnetic force of a magnet.

In one or more examples, the substrate processing device 100 may further include a vacuum chamber (see, e.g., FIG. 5D) for providing a space where the titanium cooling plate 110, the electrostatic chuck 120, and the yoke plate 130 are to be mounted. Further, the substrate processing device 100 may include, under the electrostatic chuck 120, a gas jetting unit positioned inside the vacuum chamber to jet a gas for depositing various films on the glass substrate 10. In one or more examples, a display (e.g., a large-sized display) may include or use the glass substrate 10 with various films deposited thereon.

In one or more examples, the size of the glass substrate 10 may be about 1850×1500 mm to about 2290×1310 mm, which is the 6th generation full size (6GF) to the 8.6th generation half size (8.6GH), and the substrate processing device 100 may be a device for depositing a film on the glass substrate 10 of the 6th generation full size to the 8.6th generation half size. In one or more examples, the size of the glass substrate may be about 2200×1250 mm, which is the 8.5th generation half size (8.5GH), and the substrate processing device 100 may be a device for depositing a film on the 8.5th generation half-size glass substrate.

The yoke plate 130 may be disposed to overlap the titanium cooling plate 110 when viewed in a plan view. The yoke plate 130 may be positioned above the titanium cooling plate 110. The yoke plate 130 may include a plurality of magnets 131 attached to a lower portion thereof. The yoke plate 130 may suck (or draw in, bring in, pull in, or take in) and fix the mask 20 positioned below the glass substrate 10 by the magnetic force of the magnet 131. Here, the yoke plate 130 may move upward and downward, and when the mask 20 is adjacent to the glass substrate 10, the yoke plate 130 may fix the mask 20 to the lower portion of the glass substrate 10 in tight contact with the lower portion of the glass substrate 10 by the magnetic force.

In one or more examples, the mask 20 is a sheet-type thin metal film and may have a plurality of open areas (or open holes) for passing the deposition material. In one or more examples, the mask 20 may be a mask formed of an invar material. The outer side of the mask 20, which is an edge when viewed in a plan view, may be fixed and supported by the mask frame 21. The glass substrate 10 may be disposed on the mask 20, and the electrostatic chuck 120 may be positioned on the glass substrate 10. The electrostatic chuck 120 may fix the glass substrate 10 using an electrostatic force, and the yoke plate 130 may fix the mask 20 to a lower portion of the glass substrate 10 using a magnetic force. In one or more examples, the electrostatic chuck 120 may prevent the glass substrate 10 from moving during alignment and deposition processes.

Figure 2:
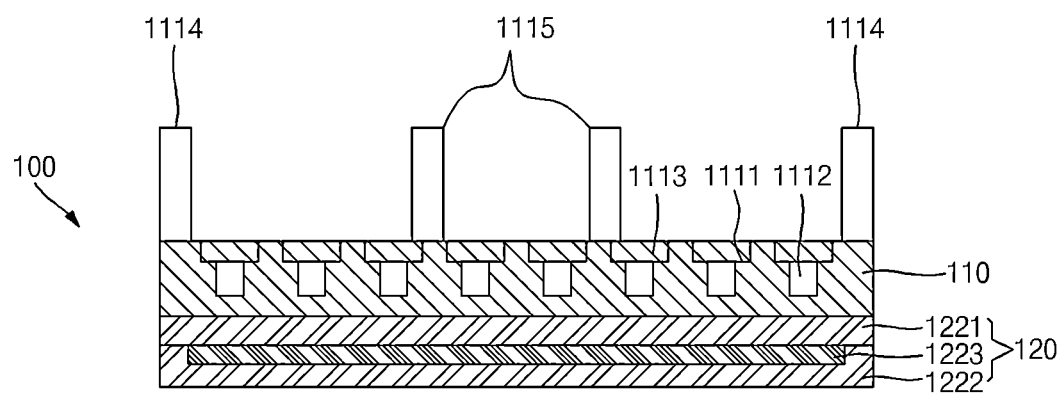
FIG. 2 is an enlarged example view schematically illustrating a partial area of the substrate processing device of FIG. 1.

FIG. 2 is an enlarged example view schematically illustrating the substrate processing device of FIG. 1. Hereinafter, an example substrate processing device 100 according to one or more example embodiments of the disclosure is described with reference to FIGS. 1 and 2.

The example substrate processing device 100 according to one or more example embodiments of the disclosure may have a substantially rectangular plate shape, and may suck and fix the glass substrate 10 positioned on the lower surface thereof by electrostatic force, and may also suck and fix the mask 20 positioned below the glass substrate 10 by magnetic force. The substrate processing device 100 may include a titanium cooling plate 110 and an electrostatic chuck 120. A titanium cooling plate may be sometimes referred to as a titanium plate, a cooling plate, a plate with cooling capacity, or an upper plate. An electrostatic chuck may be sometimes referred to as a chuck, a multilayered plate, a plate with dielectric and electrode layers, or a lower plate. A glass substrate may be sometimes referred to as a substrate or a dielectric substrate.

The substrate processing device 100 may be used in a high-density plasma environment to enhance deposition efficiency during thin film deposition. In the substrate processing device 100 for manufacturing large-area displays, the surface temperature of the glass substrate 10 mounted under the electrostatic chuck 120 may be increased to a temperature range of about 200° C. to about 800° C.

The titanium cooling plate 110 may have a substantially rectangular plate shape having a predetermined length and width. The titanium cooling plate 110 may have one side that has a length of about 1500 mm to about 2290 mm. In one or more examples, the titanium cooling plate 110 may be easily moved in a predetermined direction (e.g., a direction in which the process is performed) along a guide rail as a transferring/supporting member is coupled to the side surface or the upper surface, but the disclosure is not limited thereto.

The titanium cooling plate 110 may have a plurality of cooling flow paths 1112 having a predetermined pitch, therein. The cooling medium may be moved in the cooling flow path 1112 to cool the titanium cooling plate 110 to a predetermined temperature. In one or more examples, the titanium cooling plate 110 may have a cooling flow path 1112 to reduce and maintain the temperature of the electrostatic chuck 120 to a temperature range of about 0° C. to 500° C., thereby minimizing thermal deformation. Further, the titanium cooling plate 110 may have the cooling flow path 1112 to maintain a constant surface temperature of the electrostatic chuck 120 used in the high density plasma environment.

Figure 3:
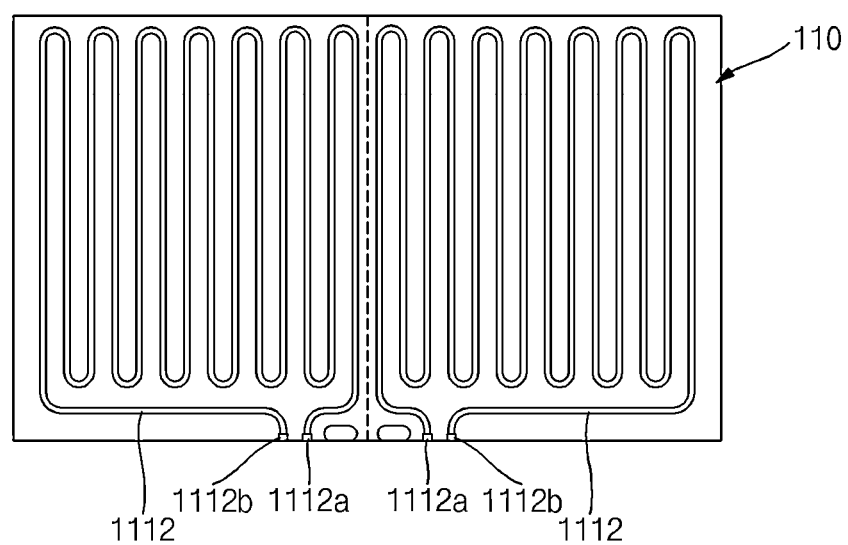
FIG. 3 is an example plan view illustrating a cooling flow path in a titanium cooling plate of the substrate processing device of FIG. 2.

For example, the cooling medium may be a fluorinated liquid, pure water, and an equivalent material thereof, but the disclosure is not limited thereto. Here, the cooling flow path 1112 may include at least two flow paths. FIG. 3 is an example plan view illustrating a titanium cooling plate 110 having two flow paths 1112. Referring to FIG. 3, in the two cooling flow paths 1112, the cooling medium may be injected through the input end 1112a for each flow path, and the cooling medium injected through the input end 1112a of each flow path may be discharged through the output end 1112b. For example, when one cooling flow path 1112 is provided, the cooling efficiency may reduce toward the output end due to an increase in the temperature of the cooling medium that has moved through a certain portion of the cooling flow path 1112 provided in the titanium cooling plate 110. In other words, the titanium cooling plate 110 may have a cooling flow path 1112 having at least two channels. FIG. 3 illustrates that the cooling flow paths 1112 are provided on two opposite sides, but the disclosure is not limited thereto. Further, the cooling flow path 1112 may have an area extending in a straight line shape or bent in a curved shape and/or a meandering shape so that the cooling medium is movable, and various changes may be made to the arrangement shape. In one or more examples, a titanium cooling plate may employ a cooling flow path(s) having a different structure or shape.

Referring back to FIG. 2, the titanium cooling plate 110 may include a substantially flat upper surface and a substantially flat lower surface opposite to the upper surface. Further, the titanium cooling plate 110 may further include a first channel 1111 having a first width provided from the upper surface toward the lower surface, a second channel 1112 having a second width smaller than the first width provided from the first channel 1111 toward the lower surface, and a titanium cover plate 1113 welded to the first channel 1111. In one or more examples, the width of the first channel 1111 may be equal to or similar to the width of the titanium cover plate 1113. In this way, a cooling flow path 1112 through which a cooling medium flows may be provided inside the titanium cooling plate 110 by the second channel 1112. It is noted that the same reference numeral 1112 is used for convenience to denote the second channel and/or the cooling flow path(s) as the cooling flow path(s) 1112 may be provided by the second channel 1112.

In one or more examples, the titanium cover plate 1113 may be welded to the first channel 1111 by an electron beam radiation device in a vacuum chamber to prevent oxidation during welding.

In one or more examples, the titanium cooling plate 110 may have a thickness of about 7 mm to about 12 mm at which the mask 20 is chucked on (or pulled onto or attached to) the glass substrate 10 by the magnetic force of the yoke plate 130 and is not bent by its own weight. When the thickness of the titanium cooling plate 110 is smaller than about 7 mm, it may be difficult to maintain the rigidity of the titanium cooling plate 110 to chuck the 6th generation full size glass substrate to the 8.6th generation half glass substrate. Further, when the thickness of the titanium cooling plate 110 is greater than about 12 mm, the magnetic force of the yoke plate 130 may not be reliably or sufficiently transferred to the mask 20 due to the increase in thickness.

In one or more examples, the titanium cooling plate 110 may include titanium (Ti). In one or more particular examples, the titanium cooling plate 110 may include Ti Grade 2 having excellent cold formability and weldability and high strength. The Ti Grade 2 also has excellent oxidation resistance. In one or more examples, the titanium cooling plate 110 may have a coefficient of thermal expansion (CTE) of about $8.6 \times 10^{-6}$ m/m° C. In one or more examples, the titanium cooling plate 110 may include one or more other materials.

In one or more examples, the titanium cooling plate 110 may further include a plurality of supporting members 1114 attached along an edge thereof, and an auxiliary supporting member 1115 attached to an area corresponding to a dead zone (e.g., an area where no pixel is formed and which is chamfered out in a later process) of the mask 20 and the glass substrate 10, to prevent the titanium cooling plate 110 from warping. The area corresponding to a dead zone may be an inner area, an inner area away from the edge of the titanium cooling plate 110, or near a center or a central area of the titanium cooling plate 110. In one or more examples, the auxiliary supporting member 1115 may be provided to be symmetrical with respect to the central area of the titanium cooling plate 110. As the upper end of the auxiliary supporting member 1115 is coupled to a separate fixing or moving structure, a warping phenomenon that the central area of the titanium cooling plate 110 is bent convexly may be prevented.

The electrostatic chuck 120 may include a first dielectric layer 1221 and a second dielectric layer 1222, and an electrode layer 1223 between the first dielectric layer 1221 and the second dielectric layer 1222. In one or more examples, the first dielectric layer 1221 may be directly coated and provided on the surface of the titanium cooling plate 110 without a separate adhesive layer. The electrode layer 1223 may be provided on the surface of the first dielectric layer 1221. Further, the second dielectric layer 1222 may be provided by being directly coated on surfaces of the first dielectric layer 1221 and the electrode layer 1223.

The first dielectric layer 1221 may be provided by being directly coated on the lower surface of the titanium cooling plate 110 by an atmospheric plasma spray method. In one or more examples, the second dielectric layer 1222 may be directly coated on the lower surfaces of the electrode layer 1223 and the first dielectric layer 1221 by an atmospheric plasma spray method. In one or more examples, in addition to (or in lieu of) the atmospheric plasma spray method, a method of aerosol deposition, arc spray, high-speed oxygen fuel spray, cold spray, or flame spray may be used. In one or more examples, the first dielectric layer 1221 and the second dielectric layer 1222 may be $Al_2O_3$. In one or more examples, the first and second dielectric layers 1221 and 1222 may further include additives such as $TiO_2$, $CaO$, $MgO$, $SiO_2$, $Y_2O_3$, YOF and/or YF. The dielectric constant of the dielectric layer may be increased by such an additive, and accordingly, the chucking force may be further enhanced by static electricity. In other words, the subject technology may change the dielectric constant according to the amount of each additive added in addition to $Al_2O_3$, thereby changing the magnitude of the electrostatic force to enhance the degree and effect of desorption as well as adsorption.

In one or more examples, when the titanium cooling plate 110 is provided as titanium (CTE, 8.6) and the dielectric layers 1221 and 1222 are provided as $Al_2O_3$(CTE, 7.3), the deviation of the CTE may be about 1.5%. Since the dielectric layers 1221 and 1222 have a CTE deviation of about 1.5% from the titanium cooling plate 110, even when the dielectric layers 1221 and 1222 are directly coated on the titanium cooling plate 110, cracks or deformation due to the difference in the coefficient of thermal expansion may not occur when the temperature of the electrostatic chuck 120 increases. In one or more examples, each of the thicknesses of the first dielectric layer 1221 and the second dielectric layer 1222 may be about 20 μm to about 1000 μm. In one or more examples, the thickness of the first dielectric layer 1221 may be about 400 μm to about 600 μm, and the thickness of the second dielectric layer 1222 may be about 100 μm to about 200 μm.

The electrode layer 1223 may be provided on a lower surface of the first dielectric layer 1221 by a plating method or various spray methods or deposition methods described above. The electrode layer 1223 may be provided as a thin film of copper, aluminum, nickel, gold, silver, tungsten, molybdenum, or an alloy thereof. In one or more examples, the thickness of the electrode layer 1223 may be about 20 μm to about 100 μm.

When the thickness of the electrostatic chuck 120 is greater than 1000 μm, it is not easy to transfer the magnetic force of the yoke plate 130 due to the increase in the thickness of the electrostatic chuck 120, and thus it may not be easy to fix the mask 20. When the thickness of the electrostatic chuck 120 is smaller than 20 μm, it may be difficult to form the electrostatic chuck 120 because it is difficult to form a uniform layer. For reference, those skilled in the art will understand that although the thickness of the electrostatic chuck 120 is much smaller than the thickness of the titanium cooling plate 110, FIG. 2 does not illustrate them in the thickness ratio for a better understanding.

When a voltage is applied to the electrode layer 1223 to form an electric field, the electrostatic chuck 120 may suck and fix the glass substrate 10 in contact with the surface of the second dielectric layer 1222. Further, the electrostatic chuck 120 may be separated from the glass substrate 10 when the voltage is cut off (or removed or no longer applied) from the electrode layer 1223. Here, it will be understood by those skilled in the art that the electrostatic chuck 120 operates in a monopolar manner and/or a bipolar manner.

Since the yoke plate 130 is positioned above the titanium cooling plate 110 and the mask 20 is positioned below the electrostatic chuck 120, the thicknesses of the cooling plate 110 and the electrostatic chuck 120 may affect the driving of the yoke plate 130 in the substrate processing device according to one or more example embodiments of the disclosure. Since the cooling plate 110 is formed of titanium capable of maintaining rigidity even with a small thickness, the magnetic force of the yoke plate 130 may be easily transferred to the mask 20 through the electrostatic chuck 120, and thus the mask 20 may be easily fixed (or pulled in).

Further, even when the electrostatic chuck 120 is formed on the surface of the titanium cooling plate 110 by direct coating of the dielectric layer, the difference in the coefficient of thermal expansion between the titanium cooling plate 110 and the dielectric layer is about 1.5%, and thus deformation or cracking due to the difference in the coefficient of thermal expansion may be prevented in the substrate processing device according to one or more example embodiments of the disclosure.

Figure 4:
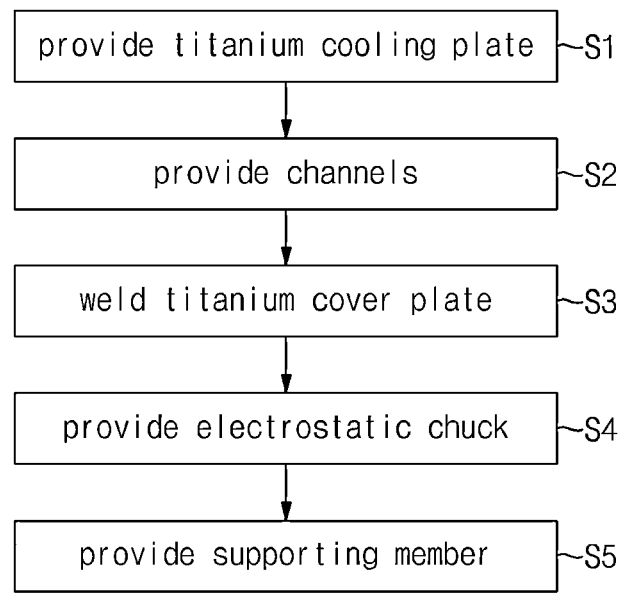
FIG. 4 is a flowchart illustrating a method for manufacturing an example substrate processing device according to one or more example embodiments of the disclosure.

FIG. 4 is a flowchart illustrating a method for manufacturing an example substrate processing device according to one or more example embodiments of the disclosure. As illustrated in FIG. 4, an example method for manufacturing a substrate processing device for horizontally fixed organic material deposition equipment for manufacturing large-area displays, according to one or more example embodiments of the disclosure, may include a titanium cooling plate providing step S1, a channel providing step S2, a titanium cover plate providing step S3, an electrostatic chuck providing step S4, and a supporting member providing step S5.

FIGS. 5A, 5B, 5C, 5D, 5E, and 5F are views schematically illustrating an example method for manufacturing a substrate processing device for horizontally fixed organic material deposition equipment for manufacturing large-area displays according to the disclosure according to one or more example embodiments of the disclosure.

Figure 5A:
FIGS. 5A, 5B, 5C, 5D, 5E, and 5F are views schematically illustrating an example method for manufacturing a substrate processing device according one or more example embodiments of the disclosure.

As illustrated in FIG. 5A, in the titanium cooling plate providing step S1, the titanium cooling plate 110 having a substantially flat upper surface and a substantially flat lower surface opposite to the upper surface may be provided. In one or more examples, the titanium cooling plate 110 may include Ti, or may include Ti Grade 2 and may be about 7 mm to about 12 mm thick. In one or more examples, the titanium cooling plate 110 may have one side that has a length of about 1500 mm to about 2290 mm.

Figure 5B:
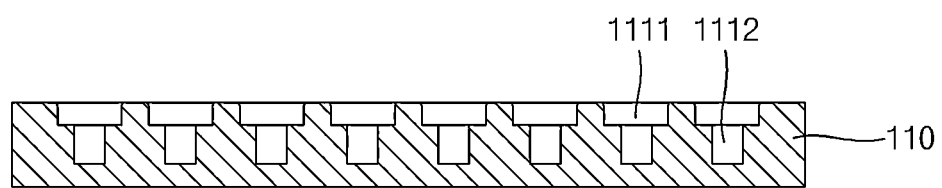

As illustrated in FIG. 5B, in the channel providing step S2, a first channel 1111 having a first width may be provided from the upper surface of the titanium cooling plate 110 toward the lower surface of the titanium cooling plate 110, and then a second channel 1112 having a second width smaller than the first width may be provided from the first channel 1111 toward the lower surface of the titanium cooling plate 110. In one or more examples, the first channel 1111 may have a first depth, and the second channel 1112 may have a second depth larger than the depth of the first channel 1111. In one or more examples, the first and second channels 1111 and 1112 may be provided by milling the upper surfaces of the titanium cooling plate 110 by slotting cutters having different widths. In one or more examples, the first and second channels 1111 and 1112 may be provided by milling the top surface of the titanium cooling plate 110 once by a sliding cutter having a multi-stage width.

Figure 5C:
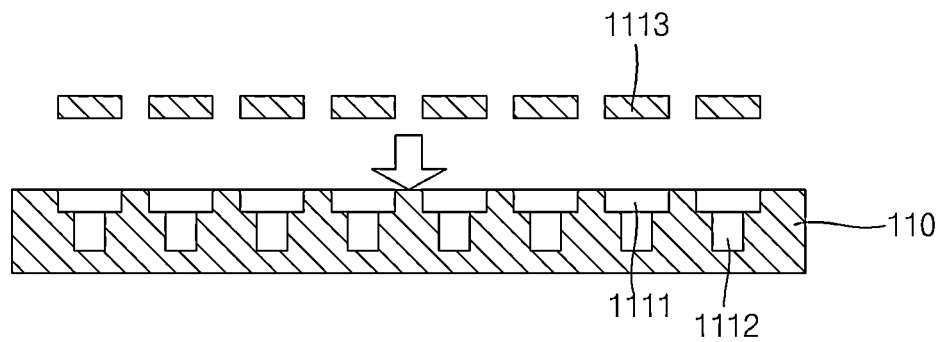
Figure 5D:
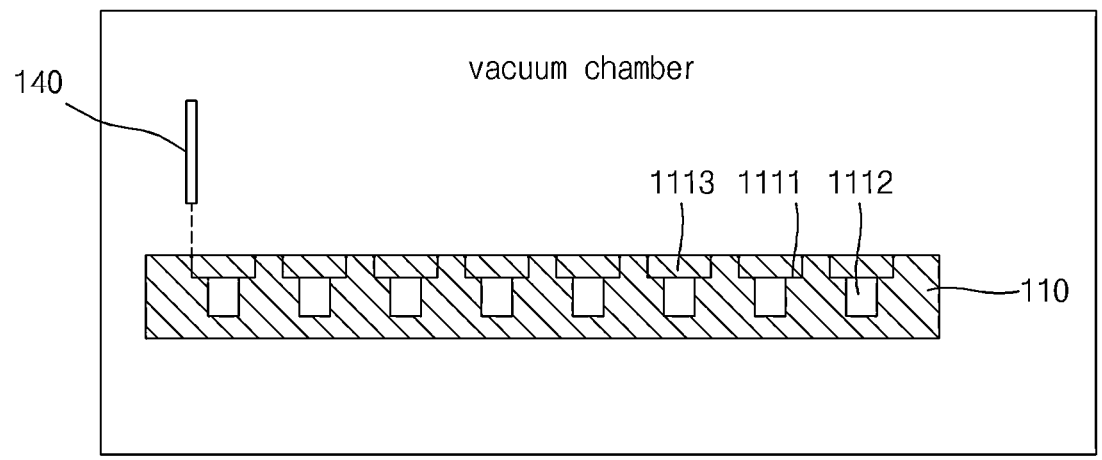

As illustrated in FIGS. 5C and 5D, in the titanium cover plate providing step S3, the titanium cover plate 1113 may be coupled to (or disposed on or disposed in) or may cover the first channel 1111 and then may be welded, providing a cooling flow path 1112 through which a cooling medium flows inside the titanium cooling plate 110 by the second channel 1112. In one or more examples, the titanium cover plate 1113 may be welded to the first channel 1111 of the titanium cooling plate 110 by an electron beam radiation device in a vacuum chamber to prevent oxidation during welding. Accordingly, in one or more aspects of the disclosure, the welded area between the titanium cooling plate 110 and the titanium cover plate 1113 may have excellent welding quality without being oxidized. In one or more examples, the material of the titanium cover plate 1113 may be identical or similar to the material of the titanium cooling plate 1110. In this way, one or more aspects of the disclosure may provide a cooling flow path 1112 having various shapes even though the titanium cooling plate 110 has a reduced thickness. In FIG. 5D, reference numeral 140 denotes the electron beam radiation device.

Figure 5E:
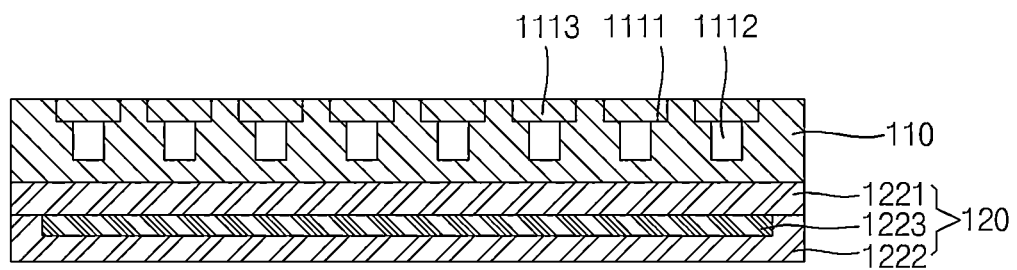

As illustrated in FIG. 5E, in the electrostatic chuck providing step S4, the electrostatic chuck 120 may be provided by directly coating the first dielectric layer 1221 on the lower surface of the titanium cooling plate 110 by an atmospheric plasma spray method, depositing or plating the electrode layer 1223 on the first dielectric layer 1221, and then directly coating the second dielectric layer 1222 on the first dielectric layer 1221 and the electrode layer 1223 by an atmospheric plasma spray method.

Figure 5F:
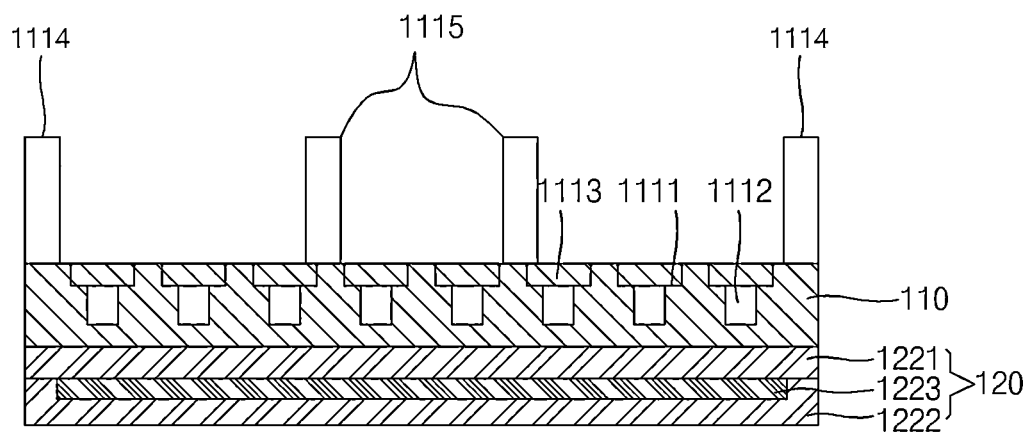

As illustrated in FIG. 5F, in the supporting member providing step S5, the plurality of supporting members 1114 may be attached to the edge of the upper surface of the titanium cooling plate 110, and the auxiliary supporting member 1115 may be attached to an area corresponding to the dead zone of the mask 20 and the glass substrate 10 as the inside of the edge. The supporting member 1114 and the auxiliary supporting member 1115 are coupled to an upper fixed structure or a moving structure to support the cooling plate 110 and the electrostatic chuck 120. In this case, the auxiliary supporting member 1115 may prevent the central area of the titanium cooling plate 110 from warping downward.

As such, the cooling plate 110 and the electrostatic chuck 120 may be integrated, thereby uniformly controlling (cooling) the temperature of the entire area of the glass substrate 10. In other words, unlike an approach in which the electrostatic chuck is provided on the aluminum plate, and a separate cooling plate is provided on the rear surface of the aluminum plate, one or more embodiments of the disclosure directly provide the electrostatic chuck 120 on a titanium cooling plate 110 having a cooling flow path 1112, thereby enhancing temperature uniformity and cooling efficiency on the glass substrate.

Further, one or more embodiments of the disclosure may sufficiently chuck the mask 20 below the glass substrate 10 with a magnetic force by using the titanium cooling plate 110 having a reduced thickness. In other words, in one or more embodiments of the disclosure, the electrostatic chuck 120 is directly provided on the lower surface of the titanium cooling plate 110 having a thickness of about 7 mm to about 12 mm, so that the magnetic force of the yoke plate 130 positioned on the upper surface of the titanium cooling plate 110 may be sufficiently transferred to the mask 20 positioned on the lower surface of the electrostatic chuck 120 and the titanium cooling plate 110.

Further, in one or more embodiments of the disclosure, by using the titanium cooling plate 110 having a reduced thickness but high rigidity, it is possible to allow the electrostatic chuck 120 to sufficiently chuck a large-area substrate (e.g., a 6th generation glass substrate to an 8.6th generation half glass substrate) without warping. Further, according to one or more example embodiments of the disclosure, as the titanium cooling plate 110 has a reduced thickness, the weight of the device may be significantly reduced. Thus, the load of the aligning device (e.g., UVW stage) or moving equipment (e.g., magnetic levitation device) may be reduced.

Further, in one or more embodiments of the disclosure, the temperature uniformity and cooling efficiency of the glass substrate 10 may be enhanced by the titanium cooling plate 110 capable of providing the cooling flow path 1112 despite having a reduced thickness. In other words, according to one or more example embodiments of the disclosure, channels 1111 and 1112 having a stepped cross section may be provided on one surface of the titanium cooling plate 110, a partial area 1111 of the channel may be blocked by the titanium cover plate 1113, and then welded to the titanium cooling plate 110 without oxidation by using an electron beam in the vacuum chamber, thereby providing the cooling flow path 1112 to the cooling plate 110 having a reduced thickness (about 7 mm to about 12 mm).

While the disclosure has been shown and described with reference to example embodiments of the substrate processing device for manufacturing large-area displays according to one or more example embodiments of the disclosure, it will be apparent to those of ordinary skill in the art that various changes in form and detail may be made thereto without departing from the spirit and scope of the disclosure.

The above description has been presented to enable any person skilled in the art to make, use and practice the technical features of the disclosure, and has been provided in the context of one or more particular applications and their requirements as examples. Various modifications, additions and substitutions to the described embodiments will be readily apparent to those skilled in the art, and the principles described herein may be applied to other embodiments and applications without departing from the scope of the disclosure. The above description and the accompanying drawings provide examples of the technical features of the disclosure for illustrative purposes. In other words, the disclosed embodiments are intended to illustrate the scope of the technical features of the disclosure. Thus, the scope of the disclosure is not limited to the embodiments shown, but is to be accorded the widest scope consistent with the claims. The scope of protection of the disclosure should be construed based on the following claims, and all technical features within the scope of equivalents thereof should be construed as being included within the scope of the disclosure.

What is claimed is:

1. A substrate processing apparatus, comprising:
a titanium cooling plate having an upper surface and a lower surface opposite to the upper surface;
an electrostatic chuck including a first dielectric layer provided on the lower surface of the titanium cooling plate, an electrode layer provided on the first dielectric layer, and a second dielectric layer provided on the first dielectric layer and the electrode layer, wherein the electrostatic chuck is configured to chuck a glass substrate supplied from below using an electrostatic force; and
a yoke plate positioned on the upper surface of the titanium cooling plate, wherein the yoke plate is configured to chuck a mask supplied from below the glass substrate using a magnetic force,
wherein the titanium cooling plate further includes:
a first channel provided from the upper surface toward the lower surface and having a first width;
a second channel provided from the first channel toward the lower surface and having a second width smaller than the first width; and
a titanium cover plate coupled to the first channel, and
wherein the titanium cooling plate provides a cooling flow path using the second channel, and the cooling flow path is configured to allow a cooling medium to flow.

2. The substrate processing apparatus of claim 1, wherein the titanium cover plate is coupled to the first channel by welding.

3. The substrate processing apparatus of claim 1, wherein the titanium cooling plate has a thickness of about 7 mm to about 12 mm to prevent the mask from being warped by its own weight while allowing the mask to be simultaneously chucked to the glass substrate by the magnetic force of the yoke plate.

4. The substrate processing apparatus of claim 1, wherein the titanium cooling plate includes Ti Grade 2.

5. The substrate processing apparatus of claim 1, wherein the titanium cooling plate further includes a plurality of supporting members attached along an edge of the titanium cooling plate and one or more auxiliary supporting members attached to an area corresponding to a dead zone of the mask and the glass substrate, to prevent the titanium cooling plate from warping, and wherein the area is an inner area.

6. The substrate processing apparatus of claim 1, wherein the first dielectric layer is directly coupled to the lower surface of the titanium cooling plate without an adhesive layer, and the second dielectric layer is directly coupled to the first dielectric layer and the electrode layer without an adhesive layer.

7. The substrate processing apparatus of claim 1, wherein the cooling flow path includes at least two cooling flow paths each having a meandering shape as viewed in a plan view.

8. The substrate processing apparatus of claim 1, wherein the mask comprises an invar material.

9. The substrate processing apparatus of claim 1, wherein the glass substrate has a size of about 1850 mm×1500 mm to about 2290 mm×1310 mm.

10. The substrate processing apparatus of claim 1, wherein a thermal expansion coefficient of the titanium cooling plate is about $8.6 \times 10^{-6}$ m/m° C.

11. The substrate processing apparatus of claim 1, wherein the first dielectric layer and the second dielectric layer include $Al_2O_3$.

12. The substrate processing apparatus of claim 11, wherein the first dielectric layer and the second dielectric layer further include $TiO_2$, CaO, MgO, $SiO_2$, $Y_2O_3$, YOF, or YF.

13. The substrate processing apparatus of claim 11, wherein a deviation in a thermal expansion coefficient between the titanium cooling plate and the first dielectric layer is about 1.5%.

14. The substrate processing apparatus of claim 1, wherein a thickness of each of the first dielectric layer and the second dielectric layer is about 20 μm to about 1000 μm.

15. The substrate processing apparatus of claim 14, wherein the thickness of the first dielectric layer is about 400 μm to about 600 μm, and the thickness of the second dielectric layer is about 100 μm to about 200 μm.

16. The substrate processing apparatus of claim 1, wherein the electrode layer includes copper, aluminum, nickel, gold, silver, tungsten, or molybdenum.

17. The substrate processing apparatus of claim 16, wherein a thickness of the electrode layer is about 20 μm to about 100 μm.

18. The substrate processing apparatus of claim 1, wherein a thickness of the electrostatic chuck is about 20 μm to about 1000 μm.

19. The substrate processing apparatus of claim 18, wherein a thickness of the titanium cooling plate is greater than the thickness of the electrostatic chuck.

20. The substrate processing apparatus of claim 1, wherein the first channel has a first depth, and the second channel has a second depth larger than the first depth.

21. A method for manufacturing a display using the substrate processing apparatus of claim 1, the method comprising:
providing the substrate processing apparatus including the titanium cooling plate, the electrostatic chuck and the yoke plate;
placing the glass substrate using the electrostatic chuck; and placing the mask to the glass substrate using the yoke plate, wherein the display comprises or is made using the glass substrate.

22. A substrate fixing device, comprising:

a titanium cooling plate including an upper surface and a lower surface opposite to the upper surface; and an electrostatic chuck including a first dielectric layer disposed on the lower surface of the titanium cooling plate, an electrode layer disposed on the first dielectric layer, and a second dielectric layer disposed on the first dielectric layer and the electrode layer, wherein the electrostatic chuck is configured to fix a glass substrate disposed under the titanium cooling plate using an electrostatic force, wherein the titanium cooling plate further includes a first channel having a first width provided from the upper surface toward the lower surface, a second channel having a second width smaller than the first width provided from the first channel toward the lower surface, and a titanium cover plate coupled to the first channel.

23. A substrate fixing device, comprising:

an upper plate including an upper surface and a lower surface, wherein the upper plate includes a metal material; and a lower plate including:

a first dielectric layer provided at least on the lower surface of the upper plate;

an electrode layer provided at least on the first dielectric layer; and a second dielectric layer provided at least on the electrode layer, wherein the lower plate is configured to fix a substrate positioned under the upper plate using an electrostatic force, wherein the upper plate further includes a channel for cooling, and wherein the channel is disposed at least within the upper plate, below the upper surface, and above the lower surface.

24. The substrate fixing device of claim 23, wherein the first dielectric layer is directly coupled to the lower surface of the upper plate without an adhesive layer, and the second dielectric layer is directly coupled to the first dielectric layer and the electrode layer without an adhesive layer.

* * * * *